US006412821B1

(12) United States Patent
Schulmann et al.

(10) Patent No.: US 6,412,821 B1
(45) Date of Patent: Jul. 2, 2002

(54) DEVICE FOR THE VACUUM-TIGHT CONNECTING OF TWO BODIES OF DIFFERENT MATERIALS

(75) Inventors: Winfried Schulmann, Kleinostheim; Helmut Kaiser; Udo Wenske, both of Bruchköbel, all of (DE)

(73) Assignee: Unaxis Balzers Aktiengesellschaft, Balzers (LI)

( * ) Notice: Subject to any disclaimer, the term of this patent is extended or adjusted under 35 U.S.C. 154(b) by 0 days.

(21) Appl. No.: 09/170,091

(22) Filed: Oct. 13, 1998

(30) Foreign Application Priority Data

Oct. 13, 1997 (DE) .......................................... 197 45 185

(51) Int. Cl.[7] ................................................. F16L 17/00
(52) U.S. Cl. ............................ 285/96; 285/911; 285/41; 285/13; 285/106
(58) Field of Search ........................... 285/41, 911, 106, 285/96, 13, 342, 329, 422, 14, 7; 277/913, 608, 609, 602, 616

(56) References Cited

U.S. PATENT DOCUMENTS

| 3,151,763 A | * | 10/1964 | Paviso | |
| 3,977,428 A | * | 8/1976 | Schilling | 285/41 |
| 4,630,669 A | * | 12/1986 | Kessler et al. | 285/41 |
| 4,645,648 A | * | 2/1987 | Gongora et al. | |
| 4,778,202 A | * | 10/1988 | Schülke | 285/41 |
| 4,888,990 A | * | 12/1989 | Byran et al. | 285/911 |
| 5,039,139 A | * | 8/1991 | McElroy et al. | 285/7 |
| 5,057,131 A | * | 10/1991 | Lackner et al. | 285/7 |
| 5,133,577 A | * | 7/1992 | Schultze et al. | 285/911 |
| 6,022,052 A | * | 2/2000 | Dunn | 285/911 |

FOREIGN PATENT DOCUMENTS

| AU | 6706494 | * | 11/1967 | .................. 285/96 |
| DE | 1943196 | | 7/1966 | |
| DE | GM 19 43 196 | * | 7/1966 | |
| DE | 25 26 985 | * | 6/1975 | |
| DE | 2526985 | | 1/1976 | |
| DE | 3346959 | | 7/1985 | |
| DE | 3403317 | | 8/1985 | |
| DE | 37 29 848 | * | 5/1987 | |
| DE | 3729848 | | 3/1989 | |
| DE | 3843155 | | 8/1990 | |
| DE | 3630014 | | 10/1990 | |
| FR | 2275719 | | 1/1976 | |

OTHER PUBLICATIONS

Wutz, Max Theorie und Praxis der Vakuumtechnik, pp. 478–479.*

* cited by examiner

*Primary Examiner*—Lynne H. Browne
*Assistant Examiner*—Tomlyne A Malcolm
(74) *Attorney, Agent, or Firm*—Smith, Gambrell & Russell

(57) ABSTRACT

A device for connecting two bodies, especially a quartz body and a metallic body, which assures with few and simply formed components a high sealing ability at high temperature differences and at very low pressures and makes possible an easy assembly and disassembly. The device for the vacuum-tight connecting of two bodies of different materials, each of which has an essentially tubular end section (20, 30) and in the connected state of which the tubular end section (30) of the first body surrounds at least partially the end section (20) of the second body, includes an intermediate conduit (13) for intermediate suction removal of gases and is formed between the tubular end sections (20, 30) of the bodies with two seals (100, 150) which seal off the intermediate conduit (130).

16 Claims, 1 Drawing Sheet

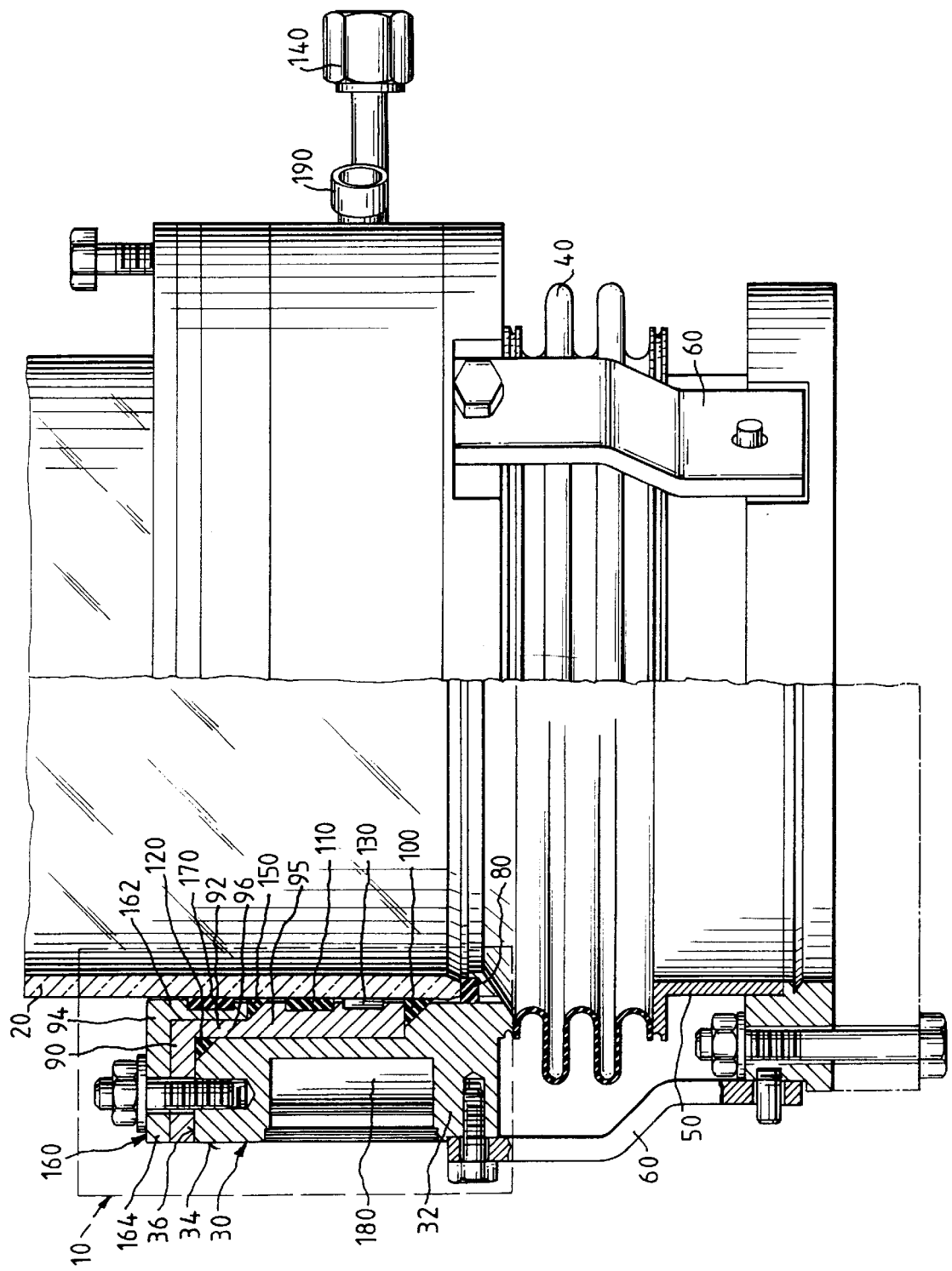

DEVICE FOR THE VACUUM-TIGHT CONNECTING OF TWO BODIES OF DIFFERENT MATERIALS

INTRODUCTION AND BACKGROUND

The present invention relates to a device for the vacuum-tight connecting of two bodies, especially a quartz body and a metallic body, each of which has an essentially tubular end section, and in the connected state of which, the tubular end section of the first body surrounds at least partially the end section of the second body. In another aspect, the present invention concerns an epitaxial system in which the connecting device can be used.

The present invention is used, for example, in epitaxial systems in which a quartz tube or the quartz container for receiving a material to be coated, e.g. wafers to be coated, is arranged. The material to be vapor-deposited is introduced by means of a quartz boat on one side of the quartz tube into the latter via a lock which can be closed vacuum-tight. The quartz tube is connected on the other side, for example, via a metallic housing to a vacuum pump apparatus in a vacuum-tight manner. Since temperatures between 500 and 800° C. can be present in the quartz tube and, furthermore, since the latter can be under a very low vacuum (e.g. $10^{-10}$ hPa) high requirements in the area of vacuum technology must be put on such quartz-metal connections which result in complicated and expensive connections. Such different materials typically have large differences in coeficients of thermal expansion.

The handbook entitled "Theorie und Praxis der Vacuumtechnik" by Wutz, Adam, Walcher, Vieweg und Sohn Braunschweig, 1982 edition, pp. 478–479 discloses a connection of a glass tube to a metallic tube. The glass tube is inserted on one end into the metallic tube and connected to the metallic tube by a screw surrounding the glass tube. Two O-rings serve for the seal. However, this connection is suitable only for connecting vacuum measuring tube of glass to metallic apparatuses. At temperatures of 500° C. to 800° C. and a very low vacuum in the glass tube this connection no longer has a reliable seal. In addition, no measures have been taken to prevent the glass tube from being able to make contact with the metallic tube upon strong heating.

A flange connection between two tubes is disclosed on page 478 of the same handbook which connection makes use of a double seal with an intermediate conduit which can be evacuated. Between the flanges two annular chambers run, into each of which an O-ring is placed. The evacuatable intermediate conduit runs between the O-rings.

An object of the present invention is to be able to connect two bodies of different materials using a few components, for easy assembly and disassembly and to obtain a high sealing ability even at large temperature differences and very low pressures.

BRIEF DESCRIPTION OF DRAWING

The present invention will be further understood with reference to FIG. 1 which shows a partial sectional elevation view of a device according to the invention.

SUMMARY OF THE INVENTION

The above and other objects of the present invention can be achieved by a device for the vacuum-tight connecting of two bodies of different materials, especially of a quartz body and a metallic body. Each of the bodies has an essentially tubular end section, and in the connected state of the bodies, the tubular end section of the first body surrounds at least partially the end section of the second body.

It is a feature of the invention that an intermediate conduit is formed between the tubular end sections of the first and second bodies. In addition, there are two seals which seal the intermediate conduction in place.

At least a first pressure device runs in the connected state at least partially between the two tubular end sections and the first seal is squeezed in the connected state between the tubular end sections and the pressure device. A first yielding spacer is arranged between the first pressure device and the end section of the second body.

DETAILED DESCRIPTION OF THE INVENTION

The device in accordance with the invention is designed for the vacuum-tight connecting of two bodies of different materials, especially of a quartz body and a metallic body, each of which has an essentially tubular end section, in the connected state of which bodies the tubular end section of the first body surrounds at least partially the end section of the second body. In addition, at least one intermediate conduit is designed between the tubular end sections which conduit is sealed by two sealing rings. The intermediate conduit is connected to a suction device which removes the gas let through by the sealing rings out of the intermediate conduit.

As shown in FIG. 1, in order to achieve a better sealing action at least a first pressure device (90) runs in the connected state at least partially between the two tubular end sections and one of the two sealing rings is squeezed in the connected state between the tubular end sections and the pressure device. A first yielding spacer is arranged between the first pressure device and the end section of the second body in order to prevent the two bodies from touching one another upon sharply different temperatures. Radial expansions of the two end sections are thus compensated by the yielding spacer.

According to a further aspect of the invention, a recess in the first pressure device forms the intermediate conduit.

An alternative embodiment contains, instead of the intermediate conduit, a first pressure device which runs in the connected state at least partially between the two tubular end sections. A first seal is arranged in such a manner that it is squeezed in the connected state between the tubular end sections and the pressure device. A first yielding spacer is arranged between the first pressure device and the end section of the second body.

In order to achieve the required sealing ability of the connection a second pressure device is provided which runs in the connected state at least partially between the first A pressure device and the end section of the second body and which squeezes in the second seal in cooperation with the first pressure device and the end section of the second body. In this manner both the first as well as the second seal can be squeezed in as regards the tubular end sections to be connected, which achieves the sealing ability striven for.

In order to assure that the second body can not enter into a connection with the pressure devices and the first body a second yielding spacer is arranged between the end section of the second body and the second pressure device.

The spacers are advantageously placed in a corresponding annular recess of the particular pressure device. A third seal arranged between the first pressure device and the end section of the first body further improves the sealing ability of the connection device.

Polytetrafluoroethylene is suitable for use as material for the spacers.

Any equivalent material can be used for this purpose.

An especially simple assembly and disassembly of the connection device is achieved in that the first and the second pressure device are designed to be essentially L-shaped. The first shank of the first pressure device runs at least partially between the end sections of the bodies to be connected and the second shank surrounds at least partially the front surface of the end section of the first body. The first shank of the second pressure device runs at least partially between the first shank of the first pressure device and the end section of the second body and the second shank of the second pressure device surrounds at least partially the second shank of the first pressure device.

The first and/or the second pressure device can be screwed in place with advantage to the first body. O-rings are used with advantage as seals.

The connection device of the invention is suitable in particular for an epitaxial system with a quartz tube operating under low pressure and exposed to high temperatures which serves in particular to receive wafers to be coated.

The connection device in accordance with the invention can be considered as a crimp connection, which is designated in the drawing in general as 10. The drawing shows crimp connection 10 in cross section as it can be used e.g. in an epitaxial system (not shown), for the coating of wafers. In such epitaxial systems a quartz tube is used, for example, of which solely tubular end section 20 is shown. The quartz tube is closed off on one side, as for example, with a lock which can be closed vacuum-tight through which lock the wafers to be coated can be loaded into the quartz tube with the aid of a quartz boat. A very low pressure of, for example, $10^{-10}$ hPa prevails in the quartz tube.

The quartz tube is connected in a vacuum-tight manner to a metallic housing 30 at tubular end section 20. In order to be able to absorb longitudinal expansions of the quartz tube caused by high temperatures in the quartz tube, which can be between 500 and 800° C., tubular end section 20 of the quartz tube is closed off with bellows 40 which connects the quartz tube, for example, to an ultrahigh vacuum pump unit via a pipe socket with flange 50. In order that bellows 40 is free of shearing forces, housing 30 is fastened via several shackles or side bars 60 to housing flange 50 of the epitaxial system. As the drawing shows, tubular end section 20 lies on bellows 40 via stop ring or end collar 80. The stop ring can be a PTFE (polytetrafluoroethylene) ring, for example.

Tubular end section 20 of the quartz tube is inserted, as the FIGURE shows, into metallic pipe socket 30. Metallic pipe socket 30 has an essentially L-shaped cross section. Shank 32 of pipe socket 30, which shank runs transversely to end section 20, is arranged at a lesser interval to end section 20 than shank 34, running parallel to tubular end section 20. Shank 32 of pipe socket 30 extends beyond tubular end section 20 and forms a collar within which the end section of bellows 40 rests. Oblong shank 34 is widened out in a flange at its front surface 36 and forms an annular groove with shank 32 in which groove annular water chamber 180 is arranged which is connected to cooling water connection 190 for cooling crimp connection 10.

A first, essentially L-shaped pressure ring 90, for example, of steel, is inserted between tubular end section 20 and shank 34 of metallic pipe socket 30. Pressure ring 90 has essentially a rather long shank 92 running parallel to tubular end section 20, which shank 92 extends to lower shank 32 of pipe socket 30 and rests on the latter. Shank 32 of pipe socket 30 is beveled off, for example, in the direction of tubular end section 20 in such a manner that it typically forms, together with tubular end section 20, a wedge-shaped circumferential groove into which groove O-ring 100 is set.

In the connected state, shank 92 of pressure ring 90 presses O-ring 100 into the wedge-shaped circumferential groove. In order that the quartz tube does not contact pressure ring 90 upon sharply different temperatures and possibly break, an annular recess is provided in shank 92 of pressure ring 90 into which annular recess a yielding or elastic spacer 110 is inserted. Even spacer 110 can consist of polytetrafluoroethylene. Pressure ring 90 comprises in addition shank 94 running vertically to tubular end section 20 which shank completely covers the flange-like front side 36 of metallic pipe socket 30 in this example. Flange-like shank 34 is beveled off in the direction facing tubular end section 20 and forms a press force fit for another sealing ring 120 in the connected state with the two contiguous shanks 94 and 92 of pressure ring 90.

In order to improve the sealing ability of crimp connection 10 of the invention another annular recess is provided in shank 92 of pressure ring 90 which recess forms a so-called intermediate conduit 130 limited by tubular end section 20. Intermediate conduit 130 is connected via connecting piece 140 to a suction device 145 which removes by suction on the one hand the gases escaping from the quartz tube into intermediate conduit 130 and on the other hand the gases entering via seal 150. Intermediate conduit 130 has the function therefore of a pressure stage for achieving an UHV (ultrahigh vacuum) pressure in the quartz tube. Intermediate conduit 130 is sealed on the one hand by seal 100 and on the other hand by a seal 150.

As FIG. 1 shows, oblong shank 92 of pressure ring 90 has a stepped profile parallel to the longitudinal axis of the quartz tube which profile, starting from shank 94, has a first section 96 whose inside diameter is greater than the inside diameter of following section 95. Section 95 therefore forms a stepped projection relative to section 96, which extends essentially to tubular end section 20 but does not contact the latter. Shank section 95 is beveled off in such a manner that it forms an essentially wedge-shaped circumferential groove together with tubular end section 20 into which groove O-ring 150 is inserted. Another pressure ring 160 is set in the free area between section 96 of shank 92 of pressure ring 90 and between tubular end section 20. Pressure ring 160 is also L-shaped. The shorter shank 162 running parallel to tubular end section 20 is arranged between section 96 of shank 92 and between tubular end section 20 and in contrast thereto longer shank 164 of pressure ring 160 completely covers shank 94 of pressure ring 90. In order to avoid that glass-like vitreous tubular end section 20 makes contact with pressure ring 160 upon extremely different temperatures, an annular groove is recessed in shank 162 in which another yielding spacer 170 is inserted. Bore holes aligned with each other are recessed in shank 164 of pressure ring 160, in shank 94 of pressure ring 90 and in flange-shaped shank 34 of metallic housing 30. Crimp connection 10 can be rapidly and simply assembled and disassembled by means of screws running through these bore holes.

It is possible, thanks to the invention, to make a crimp connection available with a few simply formed components which has a high and reliable sealing ability at large temperature differences (between 500° C. and 800° C.) and extremely low pressures (e.g. $10^{-10}$ hPa). For example to this end only the two essentially L-shaped steel pressure rings 90, 160 are provided which squeeze seals 100, 150 and 120, which are arranged between pressure rings and tube, against housing 30 in the assembled state and thus assure a strong seal. In addition, intermediate conduit 130 is recessed in pressure ring 90 to which the conduit suction device is connected in order to be able to remove exiting gases by suction.

Further various and modifications of the foregoing will be apparent to those skilled in the art and are intended to be encompassed by the claims appended hereto.

German priority application 197 45 185.3 is relied on and incorporated herein by reference.

We claim:

1. A device for the vacuum-tight connecting of two bodies of different materials, the device comprising:
 a first body, having an essentially tubular end section and being made of a first material;
 a second body, having an essentially tubular end section, and being made of a second material, wherein the end section of the first body at least partially surrounds the end section of the second body;
 an intermediate conduit, located between the tubular end section of said first body and said second body;
 a first seal and a second seal sealing the intermediate conduit between said first and second bodies; and
 a suction device, operably connected to the intermediate conduit, by which gas is removed from the intermediate conduit.

2. The device according to claim 1, further comprising:
 a first pressure device located at least partially between the two tubular end sections, the first seal being squeezed between the tubular end sections and the first pressure device; and
 a first yielding spacer arranged between the first pressure device and the tubular end section of the second body.

3. The device according to claim 1, wherein said first body is a metallic body and said second body is a quartz body.

4. A device for the vacuum-tight connecting of two bodies of different materials, the device comprising:
 a first body, having an essentially tubular end section and being made of a first material;
 a second body, having an essentially tubular end section, and being made of a second material, the end section of the first body at least partially surrounding the end section of the second body;
 an intermediate conduit, located between the tubular end section of said first body and said second body, which intermediate conduit is operably connectable to a suction device for removing gas from the intermediate conduit;
 a first seal and a second seal sealing the intermediate conduit between said first and second bodies;
 a first pressure device, located at least partially between the two tubular end sections, the first seal being squeezed between the tubular end sections and the first pressure device; and
 a first yielding spacer, arranged between the first pressure device and the tubular end section of the second body, wherein the intermediate conduit is formed as a recess in the first pressure device.

5. A device for vacuum-tight connecting of two bodies of different materials, comprising:
 a first body, having an essentially tubular end section;
 a second body, having an essentially tubular end section, wherein the first body at least partially surrounds the end section of the second body;
 a first pressure device running at least partially between the tubular end sections of the first and second bodies;
 a first seal, squeezed between the tubular end sections and the first pressure device;
 a first yielding spacer, arranged between the first pressure device and the end section of the tubular second body; and
 a suction device, operably connected to the intermediate conduit, by which gas is removed from the intermediate conduit.

6. A device for the vacuum-tight connecting of two bodies of different materials, the device comprising:
 a first body, having an essentially tubular end section and being made of a first material;
 a second body, having an essentially tubular end section, and being made of a second material, the end section of the first body at least partially surrounding the end section of the second body;
 an intermediate conduit, located between the tubular end section of said first body and said second body, which intermediate conduit is operably connectable to a suction device by which gas is removed from the intermediate conduit;
 a first seal and a second seal sealing the intermediate conduit between said first and second bodies;
 a first pressure device, located at least partially between the two tubular end sections, the first seal being squeezed between the tubular end sections and the first pressure device;
 a first yielding spacer, arranged between the first pressure device and the tubular end section of the second body; and
 a second pressure device, which runs at least partially between the first pressure device and the tubular end section of the second body, and which squeezes in said second seal in cooperation with the first pressure device and the tubular end section of the second body.

7. The device according to claim 6, wherein:
 the first and the second pressure devices each are essentially L-shaped,
 a first shank of the first pressure device runs at least partially between the end sections of the bodies to be connected and a second shank of the first pressure device surrounds at least partially the front surface of the end section of the first body, and
 a first shank of the second pressure device runs at least partially between the first shank of the first pressure device and the end section of the second body, and a second shank of the second pressure device surrounds at least partially the second shank of the first pressure device.

8. The device according to claim 6, herein at least one of the first and the second pressure devices is screwed to the first body, and the first and the second seals comprise O-rings.

9. A device for vacuum-tight connecting of two bodies of different materials, comprising:
 a first body, having an essentially tubular end section;
 a second body, having an essentially tubular end section, wherein the first body at least partially surrounds the end section of the second body;
 a first pressure device running at least partially between the tubular end sections of the first and second bodies;
 a first seal, squeezed between the tubular end sections and the first pressure device;

a first yielding spacer, arranged between the first pressure device and the end section of the tubular second body; and a second pressure device, which runs at least partially between the first pressure device and the tubular end section of the second body, and which squeezes in a second seal in cooperation with the first pressure device and the tubular end section of the second body.

10. The device according to claim 9, further comprising a second yielding spacer, arranged between the tubular end section of the second body and the second pressure device.

11. A device for the vacuum-tight connecting of two bodies of different materials, the device comprising:

a first body, having an essentially tubular end section and being made of a first material;

a second body, having an essentially tubular end section, and being made of a second material, wherein the end section of the first body at least partially surrounds the end section of the second body;

an intermediate conduit, located between the tubular end section of said first body and said second body, which is operably connectable to a suction device for removing gas from the intermediate conduit;

a first seal and a second seal sealing the intermediate conduit between said first and second bodies;

a first pressure device, located at least partially between the two tubular end sections, the first seal being squeezed between the tubular end sections and the first pressure device;

a first yielding spacer, arranged between the first pressure device and the tubular end section of the second body; and a third seal, arranged between the first pressure device and the tubular end section of the first body.

12. A device for vacuum-tight connecting of two bodies of different materials, comprising:

a first body, having an essentially tabular end section;

a second body, having an essentially tubular end section, wherein the first body at least partially surrounds the end section of the second body;

a first pressure device running at least partially between the tubular end sections of the first and second bodies;

a first seal, squeezed between the tubular end sections and the first pressure device;

a first yielding spacer, arranged between the first pressure device and the end section of the tubular second body; and a second seal, arranged between the first pressure device and the tubular end section of the first body.

13. A device for the vacuum-tight connecting of two bodies of different materials, the device comprising:

a first body, having an essentially tubular end section and being made of a first material;

a second body, having an essentially tubular end section, and being made of a second material, wherein the end section of the first body at least partially surrounds the end section of the second body;

an intermediate conduit, located between the tubular end section of said first body and said second body, operably connectable to a suction device by which gas is removed from the intermediate conduit;

a first seal and a second seal sealing the intermediate conduit between said first and second bodies; and a first and a second pressure device that are each essentially L-shaped, wherein a first shank of the first pressure device runs at least partially between the tubular end sections of the first and second bodies to be connected, and a second shank of the first pressure device surrounds at least partially a front surface of the tubular end section of the first body, and a first shank of the second pressure device runs at least partially between the first shank of the first pressure device and the tubular end section of the second body and a second shank of the second pressure device surrounds at least partially the second shank of the first pressure device.

14. The device according to claim 13, wherein at least one of the first and the second pressure devices is screwed to the first body, and the first and the second seals comprise O-rings.

15. An epitaxial system with quartz tube, which quartz tube is the second body which is connected to a metal housing by the device according to claim 1.

16. The epitaxial system according to claim 15, further comprising:

a bellows, closing the tubular end section of the quartz tube, for absorbing longitudinal expansions of the quartz tube, and an essentially annular stop element arranged between the metallic housing, the end section of the quartz tube and the bellows.

* * * * *